United States Patent [19]

Brighton

[11] Patent Number: 4,931,144
[45] Date of Patent: Jun. 5, 1990

[54] SELF-ALIGNED NONNESTED SLOPED VIA

[75] Inventor: Jeffrey E. Brighton, Katy, Tex.

[73] Assignee: Texas Instruments Incorporated, Dallas, Tex.

[21] Appl. No.: 349,020

[22] Filed: May 8, 1989

Related U.S. Application Data

[62] Division of Ser. No. 80,116, Jul. 31, 1987, Pat. No. 4,842,991.

[51] Int. Cl.$^5$ .............................................. H05K 1/00
[52] U.S. Cl. .................... 174/262; 430/314; 430/317; 430/330; 427/228; 427/229
[58] Field of Search ............... 174/68.5, 264; 430/314, 430/316, 317, 318, 330; 437/189, 195, 228, 229

[56] References Cited

U.S. PATENT DOCUMENTS

| | | | |
|---|---|---|---|
| 4,420,364 | 12/1983 | Nukii et al. | 174/68.5 X |
| 4,614,021 | 9/1986 | Hulseweh | 437/200 X |
| 4,628,149 | 12/1986 | Dohya | 174/68.5 |
| 4,638,400 | 1/1987 | Brown et al. | 174/68.5 X |
| 4,672,152 | 6/1987 | Shinohara et al. | 174/68.5 |
| 4,681,656 | 7/1987 | Byrum | 174/68.5 X |
| 4,713,494 | 12/1987 | Oikawa et al. | 174/68.5 |
| 4,736,521 | 4/1988 | Dohya | 174/68.5 X |
| 4,764,484 | 8/1988 | Mo | 437/192 X |
| 4,789,648 | 12/1988 | Chow et al. | 437/195 X |
| 4,816,323 | 3/1989 | Inoue | 174/68.5 |

Primary Examiner—Morris H. Nimmo
Attorney, Agent, or Firm—B. Peter Barndt; James T. Comfort; Melvin Sharp

[57] ABSTRACT

A via (64, 66, 68) comprises a conductor (45, 46, 48) having a first surface (58, 60, 62) and at least one second surface (49) that forms at least one edge (52) with the first surface (58, 60, 62). A first insulator layer (33) is formed on the first surface and defines a first area (58, 60, 62) on the conductor that is not covered by the first insulator layer (33). A second insulator layer (70) is formed over the second surface (49). The first and second insulator layers (33, 70) define a via (64, 66 and 68) to the conductor (45, 46, 48). The bottom area (58, 60, 62) of the via (64, 66, 68) is equal to the first area and is bounded in part by the edge (52).

7 Claims, 3 Drawing Sheets

SELF-ALIGNED NONNESTED SLOPED VIA

This is a division of application Ser. No. 080,116 filed 31st July 1987 U.S. Pat. No. 4,482,991.

TECHNICAL FIELD

This invention relates in general to semiconductor process technology and more particularly to processes for forming vias between two conductors.

BACKGROUND OF THE INVENTION

A number of methods have been investigated for reducing the size of vias between metal layers. Current conventional techniques include the pillar method and the chemical vapor deposition—tungsten via fill method.

The pillar process provides a metal plug connecting two layers of metal, which plug may be self-aligned on the edge of the lower level metal. The pillar is nonnested, i.e., does not require that the patterning be inside the lower level lead lateral boundary. The pillar process includes an oxide planarization which provides a flat surface for the upper level metal. This process has, however, a high process complexity, an additional photomask level when compared to a standard via process, and a very critical planarization process that is susceptible to interlevel shorts.

The conventional via fill process allows vias to be etched with straight walls that greatly improve size control when compared to sloped vias. However, these vias must be aligned to the lower metal layer, and therefore required to be nested within the leads. For the via fill process, therefore, it is necessary to either flare the leads or further reduce the via size. The former technique increases via resistance and current density.

A need has therefore arisen in the industry for a method for building a via which is self-aligned to the edge of the lower metal layer while being sloped to allow adequate metal coverage without requiring a via fill. A need has further appeared in the industry for a process that greatly reduces the likelihood of interlevel shorts.

SUMMARY OF THE INVENTION

The present invention comprises a via formed to a conductor. The conductor has a first surface and at least one second surface that forms an edge with the first surface. A first insulator layer is formed on the first surface and defines an area on the first surface that is not covered by the first insulator. A second insulator layer is formed over preferably all of the second surface. The first and second insulator layers define a via to the conductor, with the aforesaid area on the first surface forming the bottom of the via. The bottom area of the via is bounded in part by the edge between the first and second surfaces of the conductor. A principal advantage of the invention is obtained by this self-alignment of the via to the conductor's edge.

Preferably, the conductor is elongate and is formed on a support layer such as interlevel oxide. The conductor preferably has sides which extend outwardly from the support layer and which define a boundary of an outer surface of the conductor. The first insulator layer is formed only on the outer surface and defines first and second edges of an area of the outer surface not covered by the first insulator layer. The second insulator layer is formed so as to cover all of the sides that adjoin this area, and defines third and fourth edges of the area.

Another respect of the invention comprises a method for fabricating a via between conductors. According to this method, a first insulator layer is formed on the surface of a conductor layer. A preferably sloped orifice through the insulator layer is formed to a first area of the conductor surface. A conductor geometry border is then masked on the first insulator layer such that the border intersects a border of the orifice at at least two points. The first insulator layer is then removed to the extent that it is outside of the conductor geometry border. The conductor layer is also removed outside of this geometry border. In this manner, a first conductor is defined that has a conductor surface that is not covered by the first insulator.

A second insulator layer is next formed to cover the first conductor. A predetermined portion or depth of the second insulator layer is removed sufficient to reexpose the conductor surface area, and a second conductor is formed to contact the surface.

In a preferred embodiment, the method further includes the step of planarizing the second insulator layer prior to the step of removing portions of it until the conductor area is reexposed. This can either be done by a self-planarizing deposition of insulator material, such as oxide, or by a differential deposition of photoresist. In the case that photoresist is used, it is deposited more thickly in the topographical valleys or depressions formed by the second insulator layer, and more thinly over hills or eminences thereof. Then, the photoresist and the second insulator layer are etched back until the first area on the conductor is reexposed. Planarization prior to etch-back provides the significant technical advantage of sloped via sidewalls.

The present invention provides significant technical advantages over prior art vias in that very small sloped vias can be obtained that are self-aligned edge-on with the first level conductor. A sloped via is desirable because the resistance between the two metal conductors is decreased. Sloped vias fabricated according to conventional processes usually exceed three microns in diameter. The process of the present invention on the other hand is able to produce a self-aligned, sloped edge-on via that is less than one micron in diameter, with minimal danger of interlevel shorts. The sloped via of the invention has particularly useful application in integrated bipolar circuitry because of the high currents involved in these circuits.

BRIEF DESCRIPTION OF THE DRAWINGS

Further aspects of the invention and their advantages may be discerned from the followed detailed description in conjunction with the appended drawings in which.

DETAILED DESCRIPTION

Figure 1:
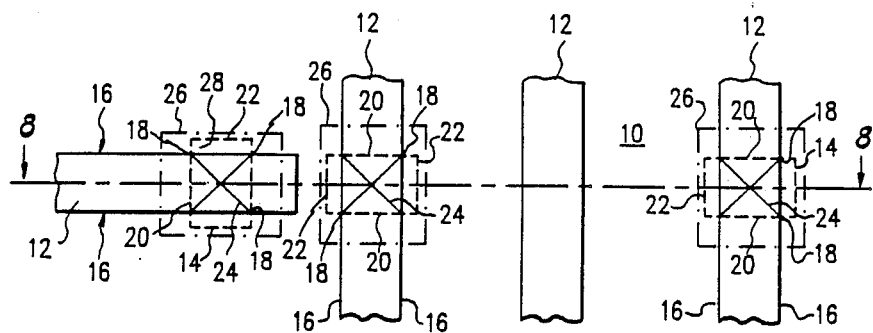
FIG. 1 is a highly magnified schematic plan view showing the juxtaposition of a mask for a plurality of first metal conductors on a support layer, with superimposed via and one-step-etch patterns shown in phantom.

FIG. 1 is a plan view of a photomask layout of the invention showing the placement of four conductors and three vias that are to be opened up to them. A support layer is indicated generally at 10. In a bipolar circuit, support layer 10 will generally comprise an oxide or other insulating layer that is disposed on a semiconductor substrate. Contacts (not shown) are made through this oxide layer 10 to selected diffused regions in the semiconductor substrate in order to connect the transistors or other semiconductor components to the rest of the circuitry.

A first conductor geometry, such as a plurality of conductor lead masks 12, is provided for the formation of one or more first conductors on top of support layer 10. A plurality of via patterns 14, here shown in phantom, are sited in registry over selected ones of the conductor lead masks 12. Each conductor lead mask 12 preferably has a pair of parallel border segments 16. Border segments 16 are preferably, but not necessarily straight, as in the case of an usual conductor lead. However, segments 16 can be designed to conform to other circuit requirements and may be irregular in shape.

Each via pattern 14 intersects a pair of segments 16 of conductor masks 12 at at least two, and preferably four, points 18. Via pattern 14 will intersect segments 16 at four points 18 in most cases, but the via pattern 14 may be sited exactly on the end of conductor mask 12 in certain instances, and therefore, a side of via pattern 14 may be contiguous or tangential (not shown) to an end border segment of conductor mask 12.

Via pattern 14 preferably comprises a pair of sides 20 that each traverse a respective conductor mask 12. These transverse sides 20 are joined together by two other opposed sides 22. The dimension from one side 22 to the other is preferably larger than the dimension between conductor mask border segments 16. This provides a technical advantage in that space for a sloped via is afforded, and the beginning via pattern 14 does not have to be so small. As will be illustrated in more detail below, the area of the prospective via thus planned is bounded by respective segments 16 and sides 20, and is shown by "X" 24.

Also used in a preferred process are a plurality of one-step-etch (OSE) patterns 26 which are shown in outline form. Each one-step-etch via pattern 26 is dimensioned so as to encompass via pattern 14, and preferably has a greater diameter than via pattern 14 in all directions.

Figure 2:
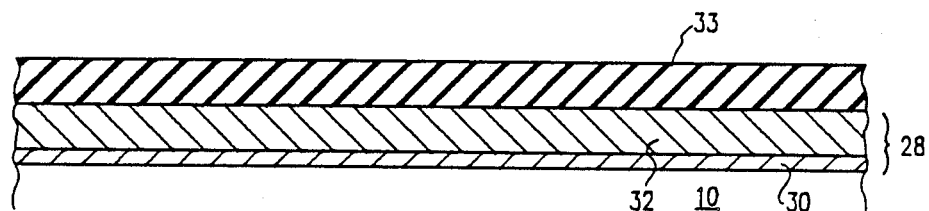
FIGS. 2-4 are cross-sectional views corresponding to line 8—8 of FIG. 1, showing beginning stages in the fabrication of a plurality of vias according to the invention.

Turning now to FIG. 2, the first steps in a preferred via fabrication process according to the invention are shown in magnified section. On a support layer 10 such as a dielectric material or a semiconductor substrate, a metal or other conductor layer 28 is deposited. In the illustrated embodiment, conductor layer 28 is comprised of a layer 30 of titanium-tungsten (Ti-W) alloy, and a layer 32 of aluminum. Layers 30 and 32 are illustrated only by way of example; other combinations of metal layers, or a single metal monolayer, or even a nonmetal conductor layer such as doped polycrystalline silicon may be deposited in their stead.

A first insulator layer such as oxide layer 33 is next deposited over metal layer 28. Layer 33 may be deposited by, for example, a low-pressure chemical vapor deposition (LPCVD).

Figure 3:
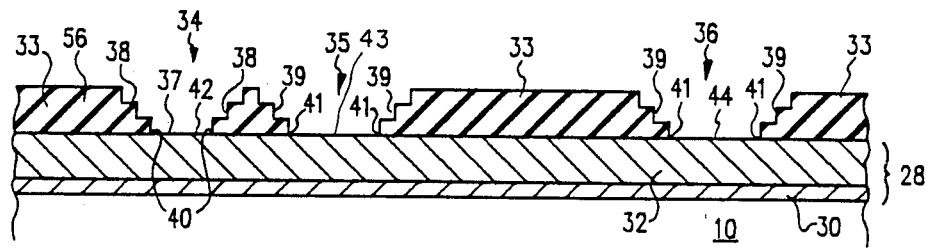

Referring next to FIG. 3, a layer of photoresist (not shown) is deposited on top of oxide layer 33 and patterned with via patterns 14 (FIG. 1). In the areas left exposed by the photoresist, orifices 34, 35 and 36 are opened wherein oxide layer 33 is etched down to expose an outer surface 37 of metal layer 28. Although a straight-wall etch can be performed, it is preferred that generally sloped orifice sidewalls 38 and 39 be formed by this etch. Preferably, a stairstep etch is performed in order to form for each orifice 34–36 a pair of transverse stairstep sidewalls 38 and a pair of longitudinal sidewalls 39. Stairstep sidewalls 38 make a general slope of 45° or less in relation to outer conductor surface 37. Stairstep sidewalls 38 adjoin outer surface 37 at transverse boundaries 40 that correspond to transverse sides 18 of via pattern 14, as shown in FIG. 1.

In orifice 35, the section taken crosses a pair of longitudinal orifice boundaries 41, and this is also the case for orifice 36. In plan view (not shown) the structure at this stage comprises rectangular stepped orifices 34, 35 and 36 that are opened to a uniform sheet 28 of conductor material, the sheet 28 not yet having been formed into the desired conductive leads or other conductor structures. In orifices 34–36, respective first areas 42, 43 and 44 are exposed on outer surface 37 that are each larger than the via to be eventually formed. After the orifice etch, the photoresist defining via patterns 14 is stripped.

Figure 4:
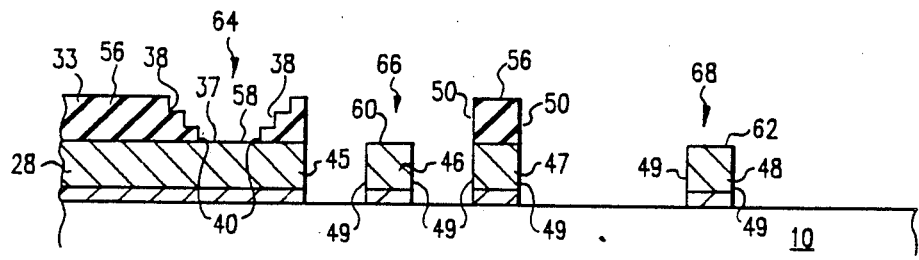

Further steps of a preferred process according to the invention are shown in FIG. 4. In this step, a photoresist mask 12 (FIG. 1) for each of a plurality of conductors 45–48 is formed on the exposed surface of first insulator layer 33, as well as on portions of orifices 34, 35 and 36 (FIG. 3). An oxide etch, and then a metal etch, are successively performed that together form metal layers 30 and 32 into a plurality of conductors 45–48. The etches performed are preferably straightwall etches such that metal layers 30 and 32 will be etched all the way down in a straightwall fashion to the support layer 10. A plurality of straight conductor sidewalls 49 and insulator sidewalls 50 are formed by the etch that correspond to border segments 16 of conductor masks 12 (FIG. 1). Sidewalls 49 form a plurality of edges 52 with outer surfaces 37.

All of the oxide layer 33 outside of the patterned conductor geometries will also be etched away, leaving only first insulator portions 56 on top of conductors 45–48. No oxide portions are shown on top of conductors 46 or 48 in FIG. 4, as only the plane of the section is shown. After this etch has taken place, transverse edges 40 are still preserved; however, longitudinal parallel edges 41 (FIG. 3) are etched away as they reside outside of conductor edges 52. At this stage, a respective final bottom area 58–62 will be defined for each of a plurality of prospective vias 64–68. Bottom areas 58–62 will further be defined by transverse edges 40 and edges 52 of respective conductors 45, 46 and 48.

Figure 5:
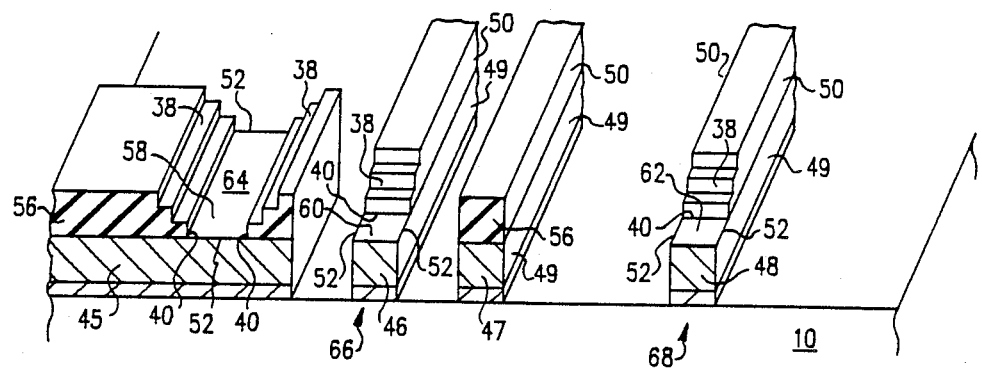
FIG. 5 is an isometric view of the structure shown in section in FIG. 4.

The details of the structure are shown in more detail in FIG. 5, which is an isometric sectional view corresponding to FIG. 4. FIG. 5 shows that sidewalls 49 and 50 of conductors 45–48 and first insulator portions 56 are defined by this etch step. After the oxide and metal etches have been successively performed, the conductor photoresist mask is stripped.

Figure 6:
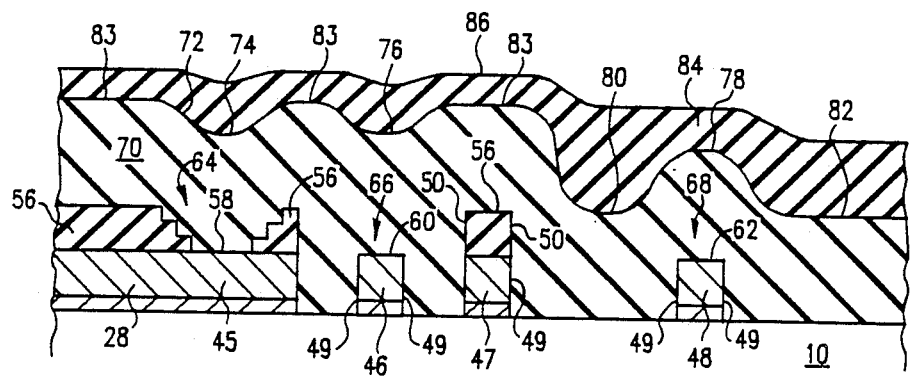
FIGS. 6-8 are schematic cross-sectional views corresponding to line 8—8 of FIG. 1, showing subsequent remaining steps in a fabrication process according to the invention.

Turning to FIG. 6, a second insulator layer, such as oxide layer 70, is next deposited over the exposed areas of substrate 10, all sidewalls 49, bottom areas 58-62 of respective vias 64-68, and preferably over first insulator portions 56. Oxide layer 70 is preferably relatively thick in relation to the thickness of first insulator layer portions 56, and forms an outer surface 72 that conforms in a general, smoothed way to the outer surfaces of first insulator portions 56, exposed areas 58-62, conductors 45, 46 and 48, and the exposed surface of support layer 10.

Over prospective vias 64-68, surface 72 will form respective depressions 74-78. Surface 72 will be further depressed in areas 80 and 82 over areas of the support layer 10 that do not have any conductors 45-48 near them. Surface 72 will form an eminence 83 over each first insulator portion 56.

Next, a layer 84 of photoresist is differentially deposited on second insulator layer 70 in order to substantially smooth or "planarize" the depressions 74-82 formed by surface 72. This differential deposit, which can for example done by spin deposition, deposits a layer 84 that is relatively thick over depressions 74-82, and is relatively thin over eminences 82. Thus, layer 84 defines a substantially "planarized" surface 86.

Figure 7:
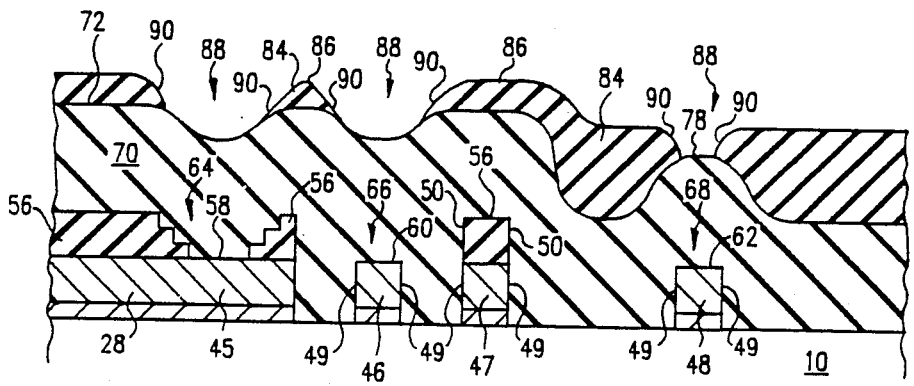

In FIG. 7, a one-step etch photoresist pattern (not shown, see pattern 26 in FIG. 1), is developed in order to remove portions 88 of the photoresist layer 84 over prospective vias 64-68. As originally developed, the remaining photoresist portions will have straight walls (not shown). The straight walls are turned into sloping photoresist sidewalls 90 as shown through a step of baking the photoresist for a short time. The temperature and the duration of the baking step are controlled such that the photoresist slumps down toward the boundaries of prospective vias 64-68 in plan projection until the desired final via bottom boundary is reached, which preferably corresponds to sides 40 and 52 (FIGS. 4 and 5).

Figure 8:
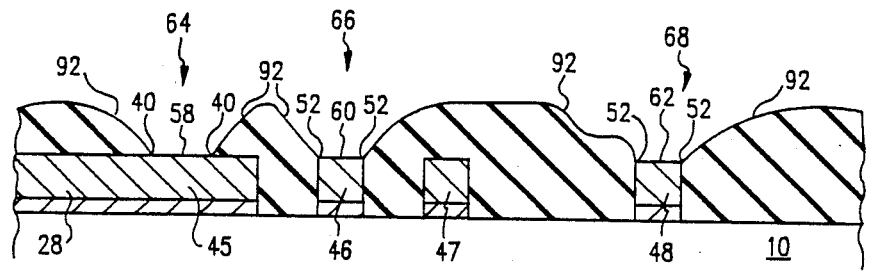

FIG. 8 shows a subsequent one-step etch-back step that defines the final form of vias 64-68. This one-step etch is performed over the entire structure, and preferably etches away the photoresist and the oxide at substantially the same rate. Therefore, the combined profile 90, 74, 86, 76 and 78 (FIG. 7) will be generally translated downward until areas 58-62 on conductors 45, 46 and 48 are reexposed. The completed vias 64-68 each have gradually sloping sidewalls 92 that form an angle of about or less than 60° with respect to surfaces 58-62. The completed vias 64-68 may then be filled with second level metal with excellent step coverage. Therefore, current density and resistance are reduced. The dimension of each via 64-68 is defined in one direction by edges 52, as is shown for conductors 46 and 48, and is defined in the other direction by edges 40 as is particularly shown for conductor 45.

Continuing from this step, the circuit may be further fabricated to include further conductor layers (not shown), or the integrated circuit may be finished off with a passivating layer such as compressive silicon nitride.

Figure 9:
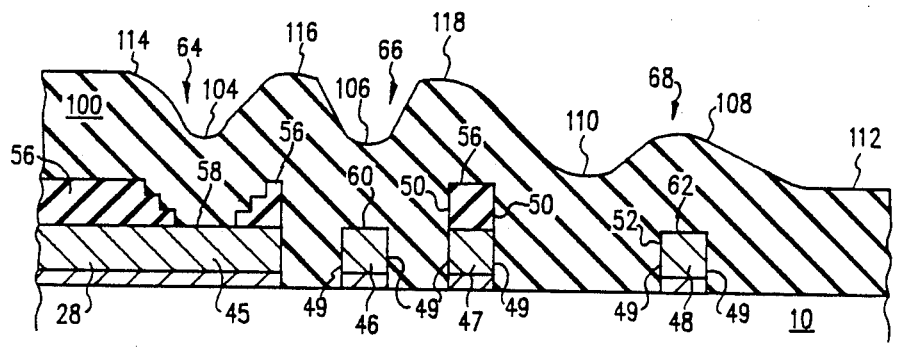
FIGS. 9–10 are schematic cross-sectional views corresponding to line 8—8 of FIG. 1, showing two steps in an alternative via fabrication process of the invention.

FIG. 9 is a cross-sectional view of an alternate semiconductor device fabrication process according to the invention, incorporating a step of "self-planarizing" oxide deposition. The cross-sectional view in FIG. 9 corresponds most closely in the fabrication sequence to FIG. 6 of the above-described embodiment. Like numbers identify like structures wherever possible.

In FIG. 9, an oxide layer 100 is deposited over conductors 45-48 and first insulator layer portions 56 in a "self-planarizing" process. According to this process, the oxide will tend to fill the valleys or depressions and will result in a substantially smoother contoured surface 102 that has depressions 104-108 in registry over each prospective via 64-68. Where no metal structures were formed on substrate 10, the contour of surface 102 is further depressed, as shown at 110 and 112. Here also eminences are formed over the first insulator portion 56, as shown at 114, 116 and 118.

Figure 10:
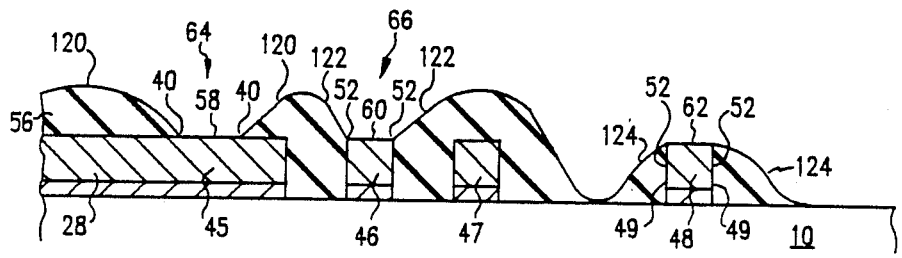

Turning next to FIG. 10, the self-planarizing oxide embodiment of the invention is shown after an etch-back step without any photoresist pattern. No photoresist is spun on, and therefore no patterning of the photoresist is done. The self-planarized oxide is simply etched back to expose areas 58, 60 and 62 of vias 64, 66 and 68. Via 64 has gradually and gently sloping sidewalls 120 which are a direct downward translation of the slopes between valley 104 and eminences 114 and 116. Likewise, via 66 has gentle slopes 122 that result from a direct downward translation of the slopes between valley 106 and prominences 116 and 118. Via 68 has downwardly sloping sidewalls 124 that result from a direct downward translation of the downward slopes from area 108.

Once again, vias 64-68 are created that are self-aligned to edges 52 in one direction, and have sloping sidewalls.

Figure 11A:
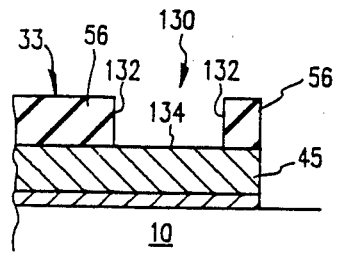
FIGS. 11a and 11b are schematic cross-sectional views of fabrication steps of another alternative embodiment of the invention using a straight-wall via etch.
Figure 11B:
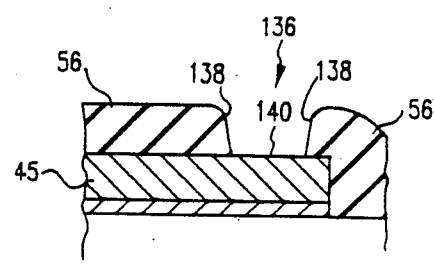

FIGS. 11a and 11b illustrate a less preferred embodiment of the invention, wherein a straight-wall via etch is used instead of a stairstep method as shown in FIG. 4. The steps shown in FIGS. 11a and 11b correspond to FIGS. 4 and 8 of the preferred process, and like numbers identify like parts whereever possible.

In FIG. 11a, a first insulator layer indicated generally at 33 is patterned and etched to produce a straight-wall orifice 130. Orifice 130 has substantially straight sidewalls 132 and defines a first exposed area 134 on the surface of conductor 45. After this straight-wall via etch is accomplished, the remaining steps in the process as shown in the first embodiment are the same.

The result of this straight-wall process is shown in FIG. 11b. A via 136 is formed that has relatively more severe sloping sidewalls 138. This sidewall slope may however still be useful for some applications. The final via bottom area indicated at 140 is smaller in a longitudinal direction than the beginning patterned size area 134.

In summary, a small, self-aligned, nonnested via and a process for fabricating this via have been described. The via has excellent sloping characteristics, and is self-aligned to the edge of the underlying conductor. This via, therefore, provides advantages in that no nesting is required, and a sloped via can be obtained in a heretofore unrealized small size. The via of the invention may be employed to advantage in any integrated circuit having more than one conductor level, and is particularly useful in bipolar technology.

While several embodiments of the invention and their advantage have been described in the above-detailed description, the invention is not limited thereto, but only by the scope and spirit of the appended claims.

What is claimed is:

1. A semiconductor arrangement having a plurality of vias formed to a conductor for use in an integrated circuit, said semiconductor arrangement comprising:

a conductor formed on one side of a support layer, sides of said conductor extending outward from said support layer and defining a boundary of an upper surface of said conductor, said sides substantially parallel to each other and said upper surface substantially parallel to said support layer;

a first insulator layer patterned on said upper surface of said conductor to define exposed areas on said conductor not covered by said first insulator layer;

a second insulator layer formed over said first insulator layer, said exposed areas and sidewalls of said exposed areas;

said vias of said semiconductor arrangement having respective bottoms formed by said exposed areas and respective sidewalls formed by said first and second insulator layers, said sidewalls sloping from said respective bottoms at approximately 60° or less.

2. The semiconductor arrangement of claim 1 wherein said conductor is one of the set of a multiple metal layer, a single metal monolayer and a nonmetal layer.

3. The semiconductor arrangement of claim 1 wherein said conductor comprises a first titanium-tungsten layer formed adjacent said support layer and a second aluminum layer formed on said first layer.

4. A semiconductor structure having a via formed to a conductor for use in an integrated circuit, said semiconductor structure comprising:

an elongate conductor formed on a support layer, sides of said conductor extending outwardly from said support layer;

an outer surface of said conductor having a boundary defined by said sides, said sides substantially parallel to each other and said outer surface substantially parallel to said support layer;

a first patterned insulator layer formed only on said outer surface, said first patterned insulator layer defining areas of said outer surface not covered by said first insulator layer, said areas having interior edges defined by said insulator area within said boundary of said conductor and exterior edges defined by said boundary of said conductor; and a second insulator layer formed over said first insulator layer, said sides of said outer surface, said areas and sidewalls of said areas said via having a bottom formed by said area and sidewalls formed by said first and second insulator layers, said sidewalls sloping away from said bottom at an angle of approximately 60° or less.

5. The semiconductor structure of claim 4, wherein said conductor is one of the set of a multiple metal layer, a single metal monolayer and a nonmetal layer.

6. The semiconductor structure of claim 4 wherein said conductor comprises a first titanium-tungsten alloy layer formed adjacent said support layer and a second aluminum layer formed on said first layer.

7. The semiconductor structure of claim 4, wherein said first and second insulator layers are silicon dioxide.

* * * * *